(12) United States Patent
Kitazawa et al.

(10) Patent No.: US 9,530,832 B2
(45) Date of Patent: Dec. 27, 2016

(54) ELECTRO-OPTICAL DEVICE AND ELECTRONIC APPARATUS

(71) Applicant: SEIKO EPSON CORPORATION, Tokyo (JP)

(72) Inventors: Takayuki Kitazawa, Suwa (JP); Takeshi Nomura, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/939,383

(22) Filed: Nov. 12, 2015

(65) Prior Publication Data
US 2016/0064469 A1 Mar. 3, 2016

Related U.S. Application Data

(63) Continuation of application No. 13/890,521, filed on May 9, 2013, now Pat. No. 9,224,908.

(30) Foreign Application Priority Data

May 15, 2012 (JP) .................................. 2012-111567

(51) Int. Cl.
*H01L 27/32* (2006.01)
*H01L 33/00* (2010.01)
*H01L 27/12* (2006.01)

(52) U.S. Cl.
CPC ......... *H01L 27/3276* (2013.01); *H01L 27/124* (2013.01); *H01L 27/3262* (2013.01); *H01L 27/3265* (2013.01); *H01L 33/0041* (2013.01)

(58) Field of Classification Search
CPC . H01L 27/3276; H01L 27/124; H01L 33/0041
See application file for complete search history.

(56) References Cited

U.S. PATENT DOCUMENTS 9,224,908 B2* 12/2015 Kitazawa ............ H01L 33/0041
2008/0017860 A1* 1/2008 Kubota ............... H01L 27/3244
257/59

(Continued)

FOREIGN PATENT DOCUMENTS

JP 2002-341790 A 11/2002
JP 2003-108036 A 4/2003

(Continued)

OTHER PUBLICATIONS

Oct. 28, 2014 Office Action issued in U.S. Appl. No. 13/890,521.

(Continued)

*Primary Examiner* — Andy Huynh
*Assistant Examiner* — Juanita Rhodes
(74) *Attorney, Agent, or Firm* — Oliff PLC

(57) ABSTRACT

An electro-optical device includes a scanning line and a data line intersecting each other, a pixel circuit provided at a position corresponding to an intersection of the scanning line and the data line, and a power supply wiring line that supplies a given potential. The pixel circuit includes a light emitting element and a driving transistor configured to control a current flowing through the light emitting element. A gate electrode of the driving transistor is electrically connected via a first relay electrode to a given node. The first relay electrode is formed in the same layer as the power supply wiring line and the data line. The first relay electrode is surrounded on at least three sides by the power supply wiring line.

18 Claims, 10 Drawing Sheets

(56) References Cited

U.S. PATENT DOCUMENTS

2012/0153286 A1* 6/2012 Yoon ................ B82Y 10/00
257/59
2013/0286054 A1 10/2013 Kitadani et al.
2014/0350366 A1* 11/2014 Akiyama .............. H01L 27/288
600/328

FOREIGN PATENT DOCUMENTS

JP         2005-031651 A      2/2005
JP         2007-148215 A      6/2007
JP         2009-198981 A      9/2009

OTHER PUBLICATIONS

May 7, 2015 Office Action issued in U.S. Appl. No. 13/890,521.
Sep. 16, 2015 Notice of Allowance issued in U.S. Appl. No. 13/890,521.

* cited by examiner

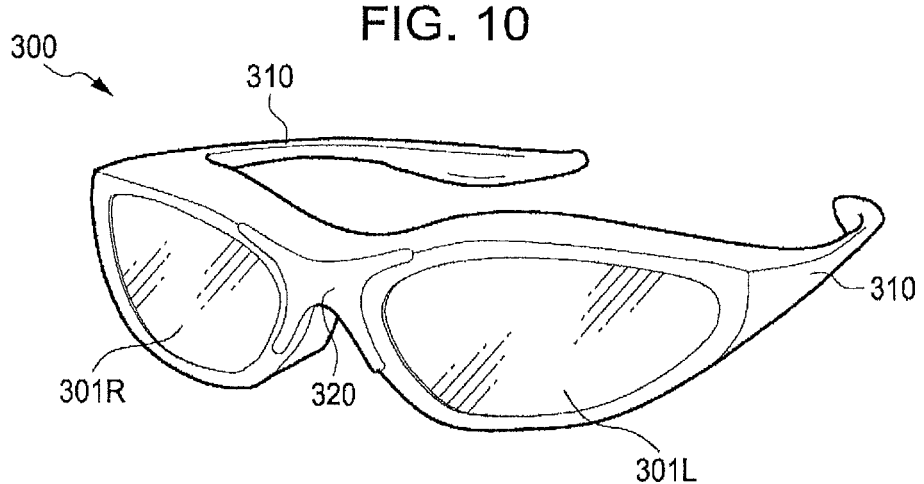
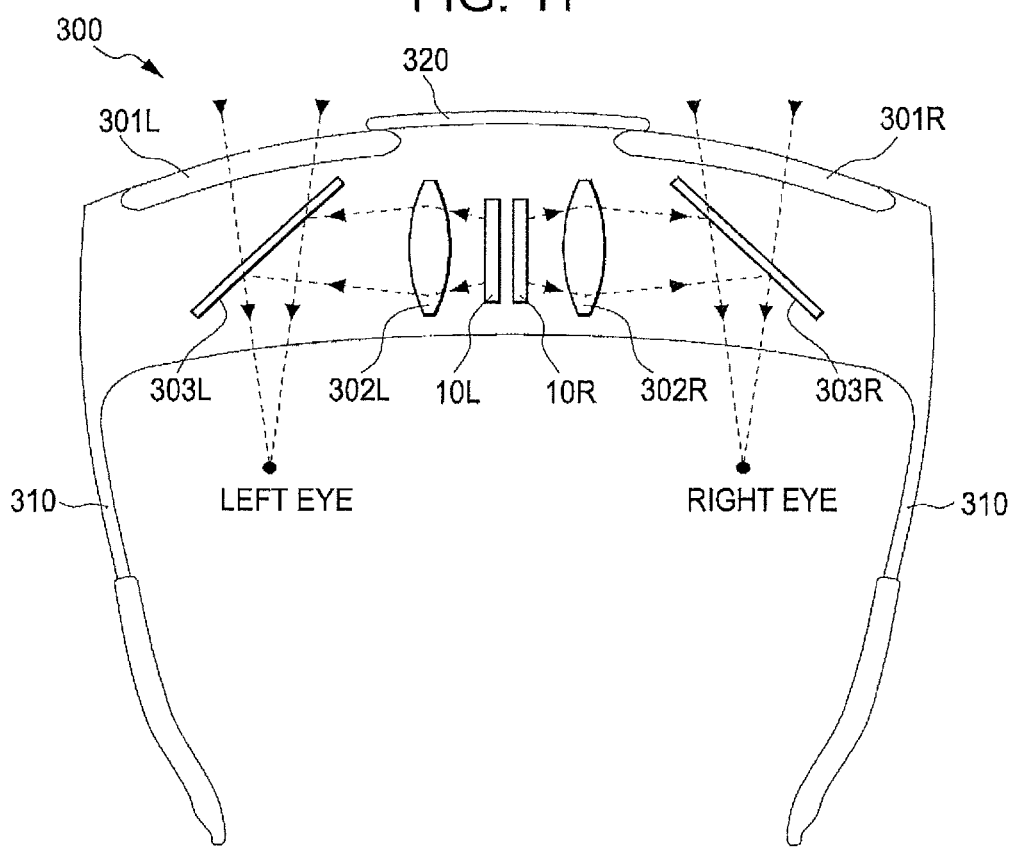

ELECTRO-OPTICAL DEVICE AND ELECTRONIC APPARATUS

This application is a Continuation of application Ser. No. 13/890,521 filed May 9, 2013 which is based upon and claims the benefit of priority from Japanese Patent Application No. 2012-111567 filed May 15, 2012, the entire contents of the prior applications being incorporated herein by reference.

BACKGROUND

1. Technical Field

The present invention relates to an electro-optical device and an electronic apparatus capable of reducing degradations in image quality associated with variations in the potential of data lines.

2. Related Art

Various types of electro-optical devices using light emitting elements such as organic light emitting diodes (hereinafter referred to as "OLEDs") have recently been proposed. In the configuration of such an electro-optical device, typically, pixel circuits including the light emitting elements mentioned above, transistors, and other components are arranged at positions corresponding to intersections of scanning lines and data lines, and the pixel circuits are provided so as to correspond to pixels of an image to be displayed. A pixel circuit using an OLED typically includes a write transistor that determines whether or not a data signal is able to be input from a data line, a driving transistor that determines, on the basis of the data signal, the amount of a current to be supplied to the OLED, and a storage capacitor that stores a data signal supplied from the data line. Furthermore, there is a technology using more elements for the purpose of achieving high image quality (for example, refer to JP-A-2002-341790).

When a pixel circuit having a configuration as mentioned above is actually driven, variations in the potential levels of data lines cause noise. The current supplied to the OLED is determined by a voltage between the gate and source of a driving transistor. Therefore, when the noise affects the gate node of the driving transistor, an accurate luminance cannot be displayed. Thus, there is unevenness in luminance. In particular, this becomes a large problem in the case where a storage capacitor connected to the gate node cannot be increased in size.

With the existing structure, noise of a data line invades the gate node of the driving transistor via a parasitic capacitance. This invasion causes data signals accumulated in the storage capacitor to vary, and, as a result, a current supplied via the driving transistor to an OLED element varies similarly. The variation is visually recognized as luminance unevenness, causing a decrease in display quality.

SUMMARY

An advantage of some aspects of the invention is that it reduces degradations in image quality associated with variations in the potential of data lines.

An electro-optical device according to an aspect of the invention includes a scanning line and a data line intersecting each other, a pixel circuit provided at a position corresponding to an intersection of the scanning line and the data line, and a power supply wiring line that supplies a given potential. The pixel circuit includes a light emitting element and a driving transistor configured to control a current flowing through the light emitting element. A gate electrode of the driving transistor is electrically connected via a first relay electrode to a given node. The first relay electrode is formed in the same layer as the power supply wiring line and the data line. The first relay electrode is surrounded on at least three sides by the power supply wiring line. An electro-optical device according to another aspect of the invention includes a plurality of scanning lines and a plurality of data lines intersecting each other, a plurality of pixel circuits provided at positions corresponding to intersections of the scanning lines and the data lines, and a power supply wiring line that supplies a given potential, the power supply wiring line being provided at a position corresponding to each of the plurality of pixel circuits. Each of the plurality of pixel circuits includes a light emitting element and a driving transistor configured to control a current flowing through the light emitting element. A gate electrode of the driving transistor is electrically connected via a first relay electrode to a given node. The first relay electrode is formed in the same layer as the power supply wiring line and the data line. The first relay electrode is surrounded on at least three sides by the power supply wiring line.

According to the aspects of the invention, among a plurality of relay electrodes that electrically connect gate electrodes of driving transistors to given nodes, a first relay electrode formed in the same layer as the data line is surrounded on at least three sides by the power supply wiring line. This reduces invasion of noise from the data line to a connection portion of the gate electrode of the driving transistor. As a result, variations in the potential of the gate electrode of the driving transistor are controlled, and the current supplied via the driving transistor to a light emitting element will not change. Thus, display with accurate luminance will be performed.

In the above electro-optical device, an initializing power supply wiring line or a power supply wiring line on a low side of a power supply may be used as the power supply wiring line. These power supply wiring lines are lower in impedance than a power supply wiring line used in the scanning line driving circuit, the data line driving circuit, or the like, their shield effects improve more.

In the above electro-optical device, it is preferable that the power supply wiring line is formed so as to be at a position between the first relay electrode and the data line, and the first relay electrode is surrounded by the power supply wiring line. Since the power supply wiring line surrounding the first relay electrode is at a position between the first relay electrode and the data line, the first relay electrode is shielded from noise radiated from the data line by the power supply wiring line. Thus, invasion of noise from the data line to the connection portion of the gate electrode of the driving transistor is suppressed. This enables display quality to be improved.

In the above electro-optical device, it is preferable that the first relay electrode is surrounded on four sides by an opening formed in the power supply wiring line. Since the first relay electrode is formed in the opening and is surrounded on four sides by the opening, its shield effect is improved more.

In the above electro-optical device, it is preferable that a second relay electrode formed in a different layer from the first relay electrode and electrically connecting the gate electrode of the driving transistor to the given node is provided, and the second relay electrode is surrounded on at least three sides by a power supply wiring line on a high side of a power supply formed in the same layer as the second relay electrode. According to the aspects of the invention, the second relay electrode is surrounded on three sides by the high-side power supply wiring line. A high shield effect is therefore attained.

Note that the invention may be conceptualized as an electro-optical device as well as a method of driving an electro-optical device or an electronic apparatus including the electro-optical device. Typical examples of the electronic apparatus include display devices such as a head-mounted display (HMD) and an electronic viewfinder.

BRIEF DESCRIPTION OF THE DRAWINGS

The invention will be described with reference to the accompanying drawings, wherein like numbers reference like elements.

FIG. 10 is a perspective view illustrating an HMD using the electro-optical device according to the embodiment and the like.

FIG. 11 illustrates an optical configuration of the HMD.

DESCRIPTION OF EXEMPLARY EMBODIMENT

Hereinafter, an exemplary embodiment of the invention will be described with reference to the accompanying drawings.

Embodiment

Figure 1:
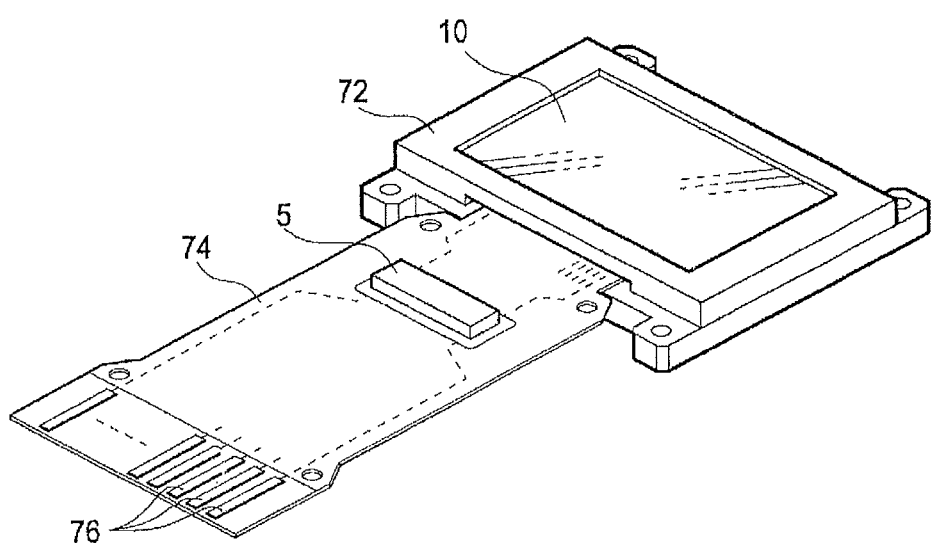
FIG. 1 is a perspective view illustrating a configuration of an electro-optical device according to an embodiment of the invention.

FIG. 1 is a perspective view illustrating a configuration of an electro-optical device 10 according to an embodiment of the invention. The electro-optical device 10 is a microdisplay that displays an image in a head-mounted display (HMD), for example. The electro-optical device 10, details of which will be described below, is an organic electroluminescent (EL) device in which a plurality of pixel circuits, driving circuits for driving the pixel circuits, and other components are formed in a silicon substrate, for example. An OLED, which is an exemplary emitting element, is used in the pixel circuit. The electro-optical device 10 is mounted in a frame-shaped case 72 having an opening for a display section. One end of a flexible printed circuit (FPC) substrate 74 is connected to the electro-optical device 10. A control circuit 5 of a semiconductor chip is mounted on the FPC substrate 74 using a chip-on-film (COF) technology. The FPC substrate 74 is provided with a plurality of terminals 76 so as to be connected to a higher-level circuit, which is not illustrated. From the higher-level circuit, image data is supplied via the plurality of terminals 76 in synchronization with synchronizing signals. The synchronizing signals include vertical synchronizing signals, horizontal synchronizing signals, and dot clock signals. In the image data, the gray scale levels of pixels of an image to be displayed are defined in 8 bits, for example. The control circuit 5 performs both functions of a power supply circuit and a data signal output circuit of the electro-optical device 10. That is, the control circuit 5 supplies various control signals and various potentials generated in accordance with the synchronizing signals to the electro-optical device 10, and also converts digital image data to analog data signals and supplies the signals to the electro-optical device 10.

Figure 2:
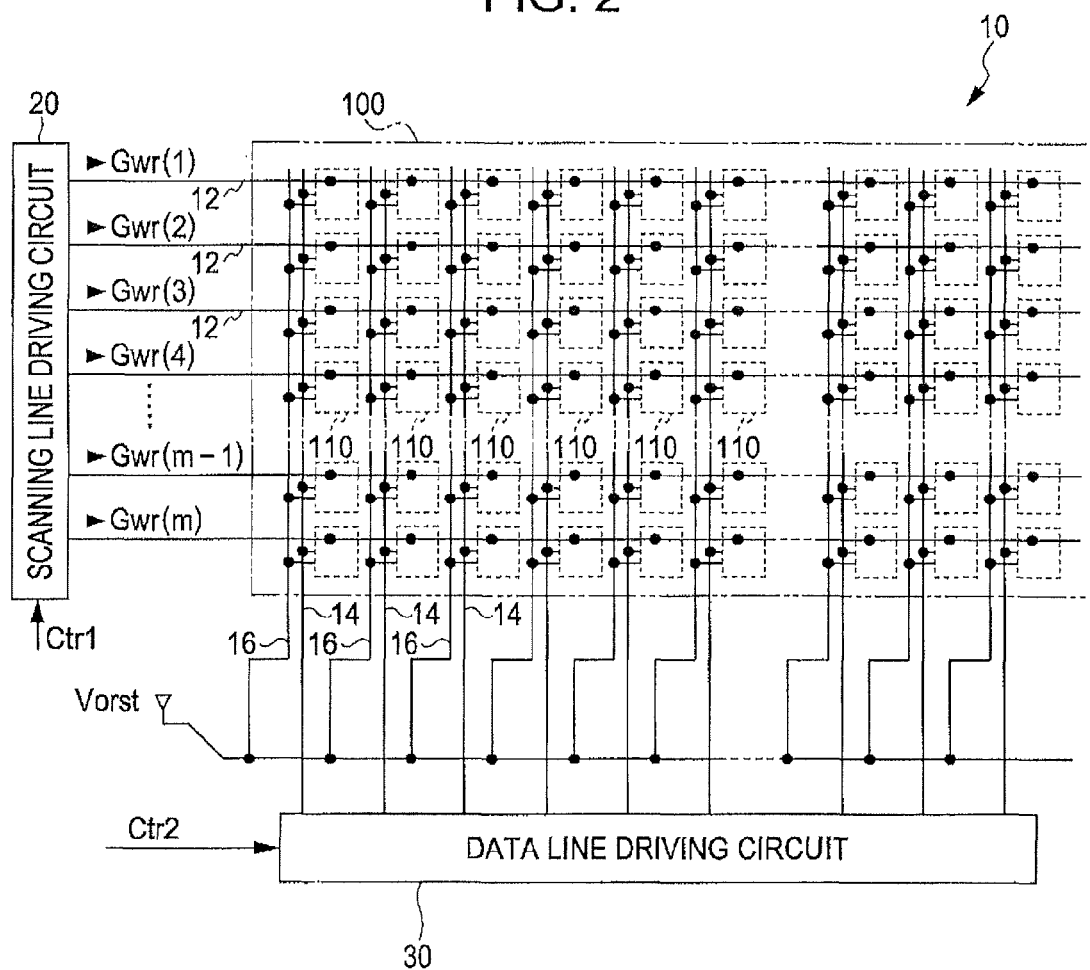
FIG. 2 is a block diagram illustrating a configuration of the electro-optical device.

FIG. 2 illustrates a configuration of the electro-optical device 10 according to this embodiment. As illustrated in this drawing, the electro-optical device 10 is broadly divided into a scanning line driving circuit 20, a data line driving circuit 30, and a display section 100. In the display section 100, among the aforementioned, pixel circuits 110 corresponding to pixels of an image to be displayed are arranged in a matrix. In particular, in the display section 100, m scanning lines 12 are provided in such a manner as to extend in the horizontal direction in the drawing, whereas n data lines 14 are provided in such a manner as to extend in the vertical direction in the drawing and in such a manner that their electrical isolation from the scanning lines 12 is maintained. The pixel circuits 110 are provided at positions corresponding to intersections of the m scanning lines 12 and the n data lines 14. For this reason, in this embodiment, the pixel circuits 110 are arranged in a matrix with m rows (horizontal lines) and n columns (vertical lines).

Here, both m and n are natural numbers. In order to distinguish individual rows in the scanning lines 12 and the matrix of the pixel circuits 110, the rows may be referred to as the 1-st, 2-nd, 3-rd, . . . , (m–1)-th, and m-th row, respectively, in order from the top of the drawing. Likewise, in order to distinguish individual columns in the data lines 14 and the matrix of the pixel circuits 110, the columns may be referred to as the 1-st, 2-nd, 3-rd, . . . , (n–1)-th, and n-th column, respectively, in order from the left side of the drawing.

In this embodiment, an initializing power supply line 16 is provided along the data line 14 for each column. A potential Vorst, which is a reset potential for initialization, is supplied in common to all the power supply lines 16.

Now, control signals as described below are supplied to the electro-optical device 10 by the control circuit 5. In particular, a control signal Ctr1 for controlling the scanning line driving circuit 20 and a control signal Ctr2 for controlling the data line driving circuit 30 are supplied to the electro-optical device 10.

In accordance with the control signal Ctr1, the scanning line driving circuit 20 generates scanning signals for scanning the scanning lines 12 sequentially, row by row, over the period of a frame. Here, the scanning signals supplied to the 1-st, 2-nd, 3-rd, . . . , (m–1)-th, and m-th scanning lines 12 are denoted by Gwr(1), Gwr(2), Gwr(3), . . . , Gwr(m–1), and Gwr(m), respectively. Note that, in addition to the scanning signals Gwr(1) to Gwr(m), the scanning line driving circuit 20 generates various control signals in synchronization with each of these scanning signals, row by row, and supplies the signals to the display section 100. These control signals are not illustrated in FIG. 2. The period of a frame is a period that is needed for the electro-optical device 10 to display an image corresponding to one cut. For example, when the frequency of a vertical synchronizing signal, which is included in a synchronizing signal, is 120

Hz, the period of a frame is 8.3 milliseconds corresponding to one period of the frequency.

Using the data line driving circuit 30, data signals are supplied for the pixel circuits 110 located in a row selected by the scanning line driving circuit 20. Data signals Vd(1), Vd(2), . . . , Vd(n) of potential levels in accordance with gray scale data of these pixel circuits 110 are supplied to the 1-st, 2-nd, . . . , n-th data lines 14 by the control circuit 5, respectively.

Figure 3:
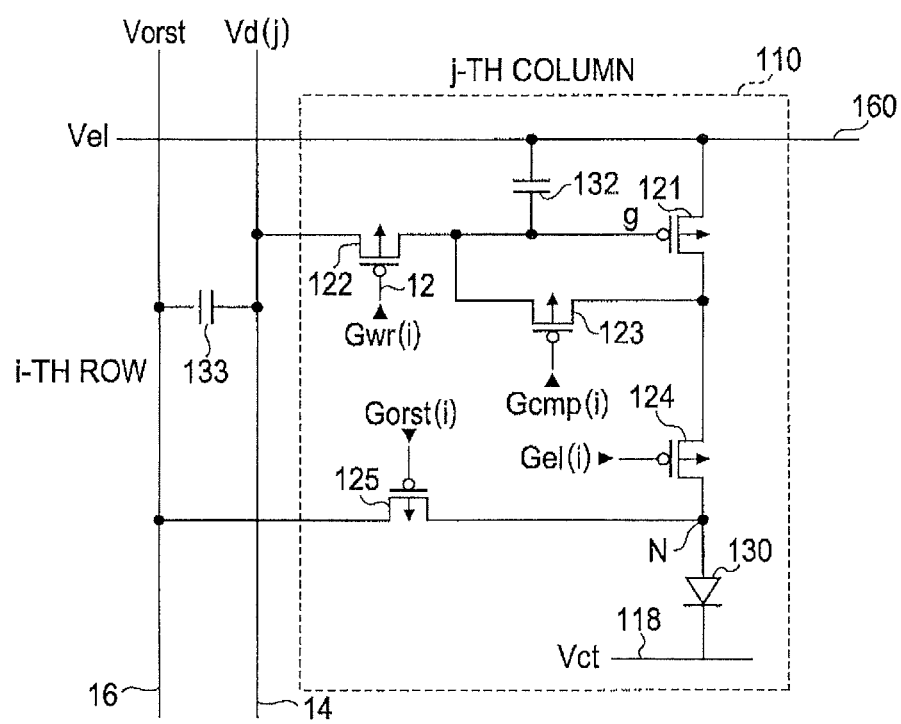
FIG. 3 is a diagram illustrating a pixel circuit in the electro-optical device.

With reference to FIG. 3, the pixel circuits 110 will now be described. Note that FIG. 3 illustrates the pixel circuit 110 corresponding to one pixel at a position corresponding to an intersection between the i-th scanning line 12 and the j-th data line 14. Here, "i" is a mark generally indicating a row in which the pixel circuits 110 are arranged, and is an integer from 1 to m. Likewise, "j" is a mark generally indicating a column in which the pixel circuits 110 are arranged, and is an integer from 1 to n.

As illustrated in FIG. 3, the pixel circuit 110 includes p-channel transistors 121 to 125, an OLED 130, and a storage capacitor 132. All the pixel circuits 110 have an identical configuration, and therefore the pixel circuit 110 located at the i-th row and the j-th column (hereinafter referred to as the "i-th row and j-th column pixel circuit 110") will be described as a representative example.

In the i-th row and j-th column pixel circuit 110, the transistor 122 functions as a write transistor. The gate node of the transistor 122 is connected to the i-th scanning line 12. One of the drain and source nodes of the transistor 122 is connected to the j-th data line 14, and the other is connected to a gate node g of the transistor 121, to an end of the storage capacitor 132, and to a drain node of the transistor 123. Here, the gate node of the transistor 121 is denoted by "g" in order to distinguish it from other nodes. A scanning signal Gwr(i) is supplied to the i-th scanning line 12, that is, to the gate node of the transistor 122.

The transistor 121 functions as a driving transistor. The source node of the transistor 121 is connected to a high potential power supply line 160, and the drain node of the transistor 121 is connected to a source node of the transistor 123 and to a source node of the transistor 124. Here, a substrate potential Vel, which is on the high side of a power supply in the pixel circuit 110, is supplied to the high potential power supply line 160.

The transistor 123 functions as a compensation transistor. A control signal Gcmp(i) is supplied to the gate node of the transistor 123. The transistor 124 functions as a light emitting control transistor. A control signal Gel(i) is supplied to the gate node of the transistor 124, and the drain node of the transistor 124 is connected to a source node of the transistor 125 and to the anode of the OLED 130.

The transistor 125 functions as an initializing transistor. A control signal Gorst(i) is supplied to the gate node of the transistor 125, and the drain node of the transistor 125 is connected to the initializing power supply line 16 corresponding to the j-th column and is maintained at the potential Vorst.

The other end of the storage capacitor 132 is connected to the high potential power supply line 160. For this reason, the storage capacitor 132 holds a source-to-drain voltage of the transistor 121. Note that, as the storage capacitor 132, a parasitic capacitance at the gate node g of the transistor 121 may be used, or a capacitance formed by sandwiching an insulating layer between conductive layers that are different from each other may be used.

Since the electro-optical device 10 is formed on a silicon substrate in this embodiment, the substrate potential of the transistors 121 to 125 is defined as the potential Vel.

The anode of the OLED 130 is a pixel electrode provided individually for each pixel circuit 110. In contrast, the cathode of the OLED 130 is a common electrode 118, which is provided common to all the pixel circuits 110, and is maintained at a potential Vct, which is on the low side of the power supply in the pixel circuit 110. The OLED 130 is an element in which a white organic EL layer is sandwiched between the anode and the cathode having light transmittance in the above-mentioned silicon substrate. In addition, a color filter corresponding to any of red (R), green (G), and blue (B) is overlaid on an emission side (the cathode side) of the OLED 130. In the OLED 130 as such, when a current flows from the anode to the cathode, holes injected from the anode and electrons injected from the cathode recombine together in the organic EL layer, thereby creating excitons. Thus, white light is emitted. With such a structure, white light emitted at this point is transmitted through the cathode on a side opposite to the side of the silicon substrate (anode), and is changed in color by the color filter. Thus, the white light is visually recognized on the side of an observer.

Operations of Electro-Optical Device

Figure 4:
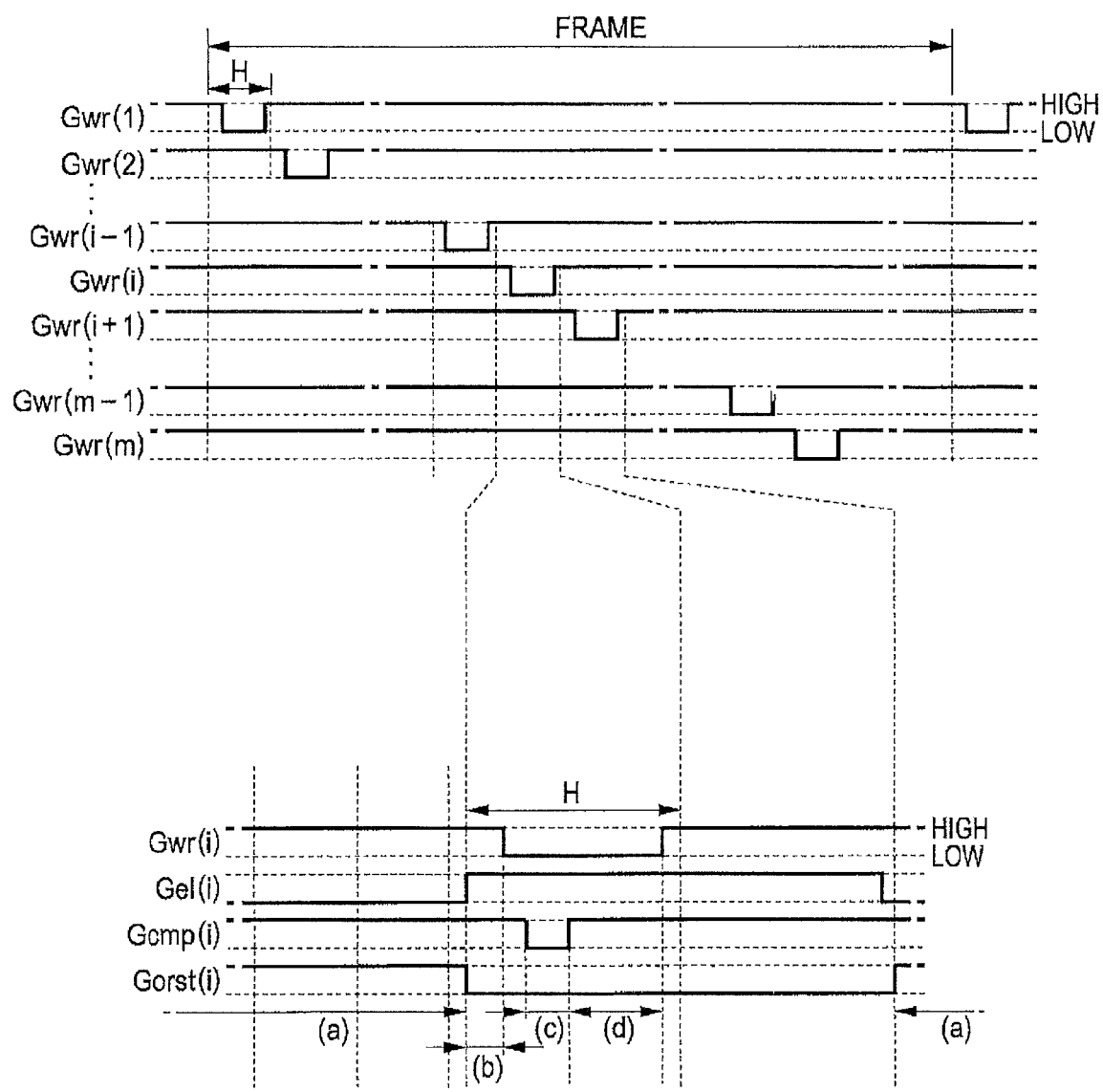
FIG. 4 is a timing chart illustrating operations of the electro-optical device.

With reference to FIG. 4, operations of the electro-optical device 10 will be described next. FIG. 4 is a timing chart for explaining operations of components in the electro-optical device 10. As illustrated in the drawing, the scanning signals Gwr(1) to Gwr(m) are sequentially switched to level L, and the 1-st to m-th scanning lines 12 are scanned in turn during the period of one frame in such a manner that one scanning line is scanned for each horizontal scanning period (H). Operations during one horizontal scanning period (H) are common to the pixel circuits 110 of each row. In view of this, paying attention particularly to the i-th row and j-th column pixel circuit 110, the operations during the scanning period when the i-th scanning line is horizontally scanned (hereinafter referred to as an "i-th row scanning period") will be described below.

In this embodiment, the i-th row scanning period is broadly divided into an initialization period denoted by (b), a compensation period denoted by (c), and a writing period denoted by (d), in FIG. 4. Then, after an interval subsequent to the writing period of (d), a light emitting period denoted by (a) commences. After a lapse of the period of one frame, the i-th row scanning period commences again. Accordingly, in terms of temporal order, a cycle of (light emitting period) →initialization period→compensation period→writing period→(light emitting period) is repeated.

Light Emitting Period

For the sake of explanatory convenience, the light emitting period, which is a precondition of the initialization period, will be described at the beginning. As illustrated in FIG. 4, in the i-th row light emitting period, the scanning signal Gwr(i) is at level H and the control signal Gel(i) is at level L. Among the control signals Gel(i), Gcmp(i), and Gorst(i), which are logic signals, the control signal Gel(i) is at level L and the control signals Gcmp(i) and Gorst(i) are at level H. Therefore, in the i-th row and j-th pixel circuit 110 illustrated in FIG. 3, the transistor 124 is on whereas the transistors 122, 123, and 125 are off. Accordingly, the transistor 121 supplies a current Ids in accordance with a gate-to-source voltage Vgs to the OLED 130. As described below, in this embodiment, the voltage Vgs during the light emitting period is level-shifted in accordance with the potential of a data signal from a threshold voltage of the transistor 121. The current having a value in accordance with a gray scale level is therefore supplied to the OLED 130 in such a manner that the threshold voltage of the transistor 121 is compensated for.

Note that since the i-th row light emitting period is a period during which scanning lines of rows other than the i-th row are horizontally scanned, the potential of the data line 14 suitably varies. In the i-th row pixel circuit 110, however, since the transistor 122 is off, the potential variation of the data line 14 is not taken into consideration here.

Initialization Period

Then, when the i-th row scanning period commences, the initialization period of (b) starts at the beginning as a first period. In the initialization period, the levels of the control signal Gel(i) and the control signal Gorst(i) change to level H and level L, respectively, from those in the light emitting period. Therefore, in the i-th row and j-th pixel circuit 110 illustrated in FIG. 3, the transistor 124 is turned off, whereas the transistor 125 is turned on. This cuts off a path through which a current is supplied to the OLED 130, and resets the anode of the OLED 130 to the potential Vorst. Since the OLED 130 has a structure in which the anode and the cathode sandwich an organic light emitting layer as described above, there exists a parasitic capacitance, the parasitic capacitance being parasitic between the anode and the cathode, in parallel to the anode and the cathode. When a current is flowing through the OLED 130 during the light emitting period, an anode-to-cathode voltage across the OLED 130 is held by this capacitance. The held voltage, however, is reset by the transistor 125 turning on. For this reason, in this embodiment, when a current flows again to the OLED 130 in the next light emitting period, the current flow is less likely to be affected by the voltage held by that capacitance.

In particular, when the display state changes from a high-luminance state to a low-luminance state, for example, a high voltage in the high-luminance state (in which a large amount of current flows) is held if a pixel circuit has a configuration that does not allow for resetting. Even if an attempt is made to allow a small amount of current to flow subsequently, an excessive current flows in reality, making it impossible to achieve a low-luminance state. In contrast, the potential of the anode of the OLED 130 is reset by the transistor 125 turning on in this embodiment. This results in enhanced reproducibility of the low-luminance side. Note that, in this embodiment, the potential Vorst is set such that the difference between the potential Vorst and the potential Vct of the common electrode 118 is less than a light emitting threshold voltage of the OLED 130. For this reason, in the initialization period (as well as the compensation period and the writing period, which will be described below), the OLED 130 is in the off (non-light emitting) state.

Compensation Period

The compensation period of (c) next commences as a second period in the i-th row scanning period. In the compensation period, the levels of the scanning signal Gwr(i) and the control signal Gcmp(i) change to level L from those in the initialization period. In the compensation period, however, a control signal /Gini is at level H under the condition that the control signal Gref remains at level H. During the compensation period, the transistor 123 is on, and therefore the transistor 121 is diode-connected. For this reason, a drain current flows through the transistor 121 to charge the gate node g and the data line 14. In particular, a current flows through a path of the high potential power supply line 160→the transistor 121→the transistor 123→the transistor 122→the j-th data line 14. Accordingly, turning on of the transistor 121 causes rises in the potentials of the data line 14 and the gate node g that are in a state of mutual connection. However, assuming that the threshold voltage of the transistor 121 is |Vth|, the closer the gate node g approaches a potential (Vel−|Vth|), the less a current is likely to flow through the above path, and therefore the data line 14 and the gate node g are saturated at a potential (Vel−|Vth|) by the time the compensation period is completed. Accordingly, the storage capacitor 132 holds the threshold voltage |Vth| of the transistor 121 by the time the compensation period is completed.

Writing Period

Subsequent to the compensation period, the writing period of (d) commences as a third period. During the writing period, the control signal Gcmp(i) changes to level H, and therefore the transistor 121 is not diode-connected. The potential in the path from the j-th data line 14 to the gate node g in the i-th row and j-th column pixel circuit 110 is maintained at (Vel−|Vth|) owing to the storage capacitor 132.

Light Emitting Period

After an interval for one horizontal scanning period subsequent to completion of the writing period for the i-th row, a light emitting period commences. In the light emitting period, since the level of the control signal Gel(i) changes to level L as mentioned above, the transistor 124 is turned on in the i-th row and j-th column pixel circuit 110. The current having a value in accordance with a gray scale level is supplied to the OLED 130 in such a manner that the threshold voltage of the transistor 121 is compensated for. Such operations are also performed in the i-th row pixel circuits 110 other than the i-th row and j-th column pixel circuit 110 temporally in parallel during the i-th row scanning period. Moreover, in reality, such operations in the i-th row are performed in the order of the 1-st, 2-nd, 3-rd, . . . , (m−1)-th, and m-th row over a period of one frame, and are repeated frame by frame.

Regarding the pixel circuit 110 described above, in reality, a parasitic capacitance exists between the data line 14 and gate node g of the pixel circuit 110. Accordingly, if the range of variations in potential of the data line 14 is large, the variations spread through the parasitic capacitance to the gate node g, thereby generating so-called cross talk, unevenness, or the like. This results in a reduction in display quality. The effect of the parasitic capacitance markedly increases when the pixel circuit 110 is miniaturized. In this embodiment, however, as described below, a connection portion between the gate electrode of the transistor 121 and another transistor or the storage capacitor is surrounded on four sides by the initializing power supply line 16. Even if noise occurs because of variations in the potential of the data line 14 or other reasons, the noise has no influence on the connection portion between the gate electrode of the transistor 121 and another transistor or the storage capacitor. Thus, variations in the potential of the gate electrode of the transistor 121 are controlled. As a result, good display quality is achieved. Details of this will be described below.

According to this embodiment, a period longer than a scanning period, for example, two horizontal scanning periods can be allocated as a period during which the transistor 125 is on, that is, a reset period of the OLED 130. This allows voltage held by the parasitic capacitance of the OLED 130 during a light emitting period to be sufficiently initialized.

According to this embodiment, in the current Ids supplied to the OLED 130 by the transistor 121, the influence of the threshold voltage on the current Ids is offset. Therefore, according to this embodiment, if the threshold voltage of the transistor 121 varies for every pixel circuit 110, the variation is compensated for and a current having a value in accordance with a gray scale level is supplied to the OLED 130. Display unevenness that impairs the display uniformity of a display screen is therefore inhibited. As a result, high-quality display may be achieved.

Furthermore, according to this embodiment, the connection portion between the gate electrode of the transistor 121 and another transistor or the storage capacitor is surrounded on four sides by the initializing power supply line 16. Even if noise occurs because of variations in the potential of the data line 14 or other reasons, the noise has no influence on the connection portion between the gate electrode of the transistor 121 and another transistor or the storage capacitor, and variations in the potential of the gate electrode of the transistor 121 are controlled. As a result, poor display such as display unevenness may be reduced.

Structure of Pixel Circuit

Figure 5:
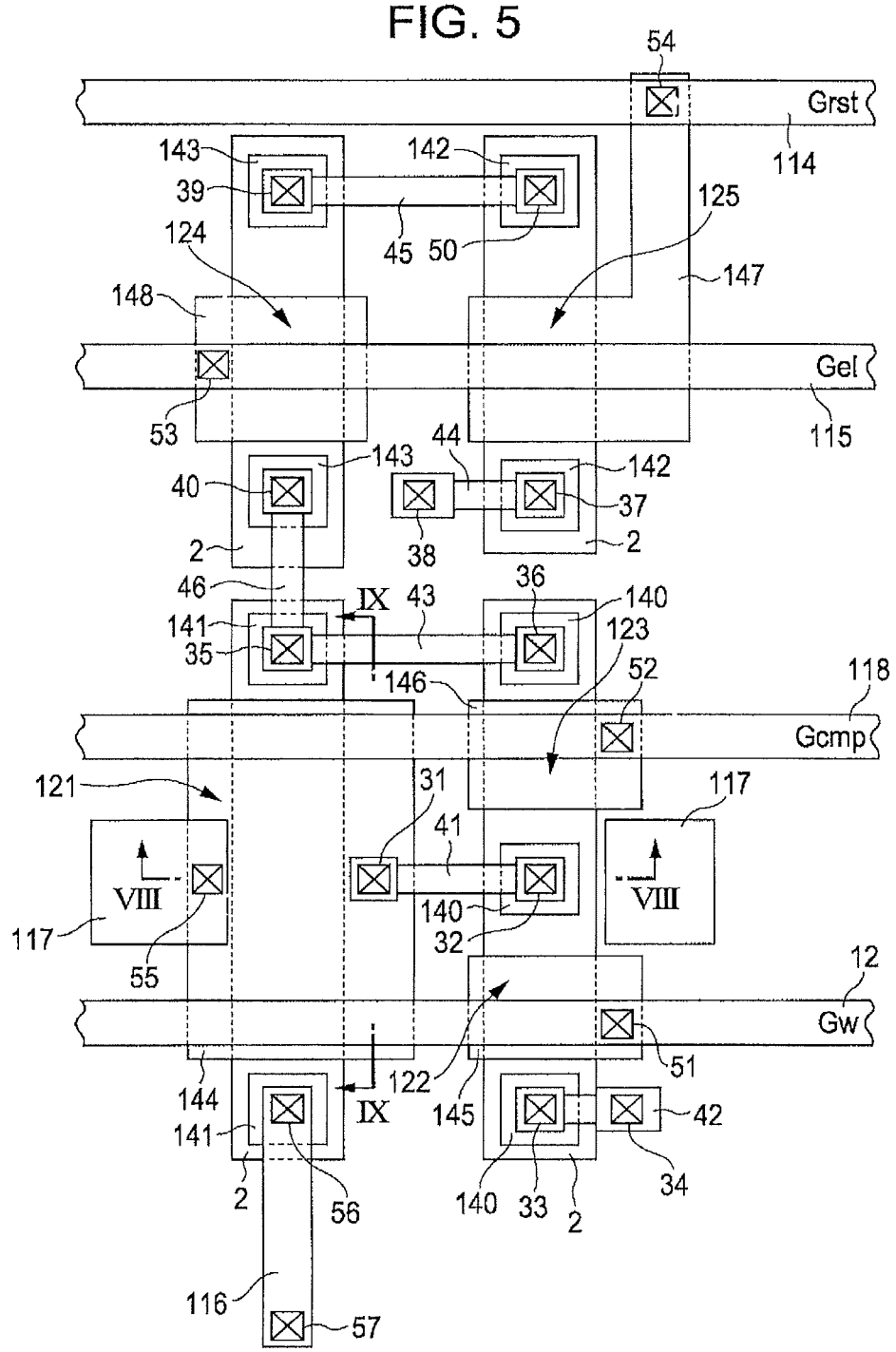
FIG. 5 is a plan view illustrating a configuration of the pixel circuit in the electro-optical device.
Figure 6:
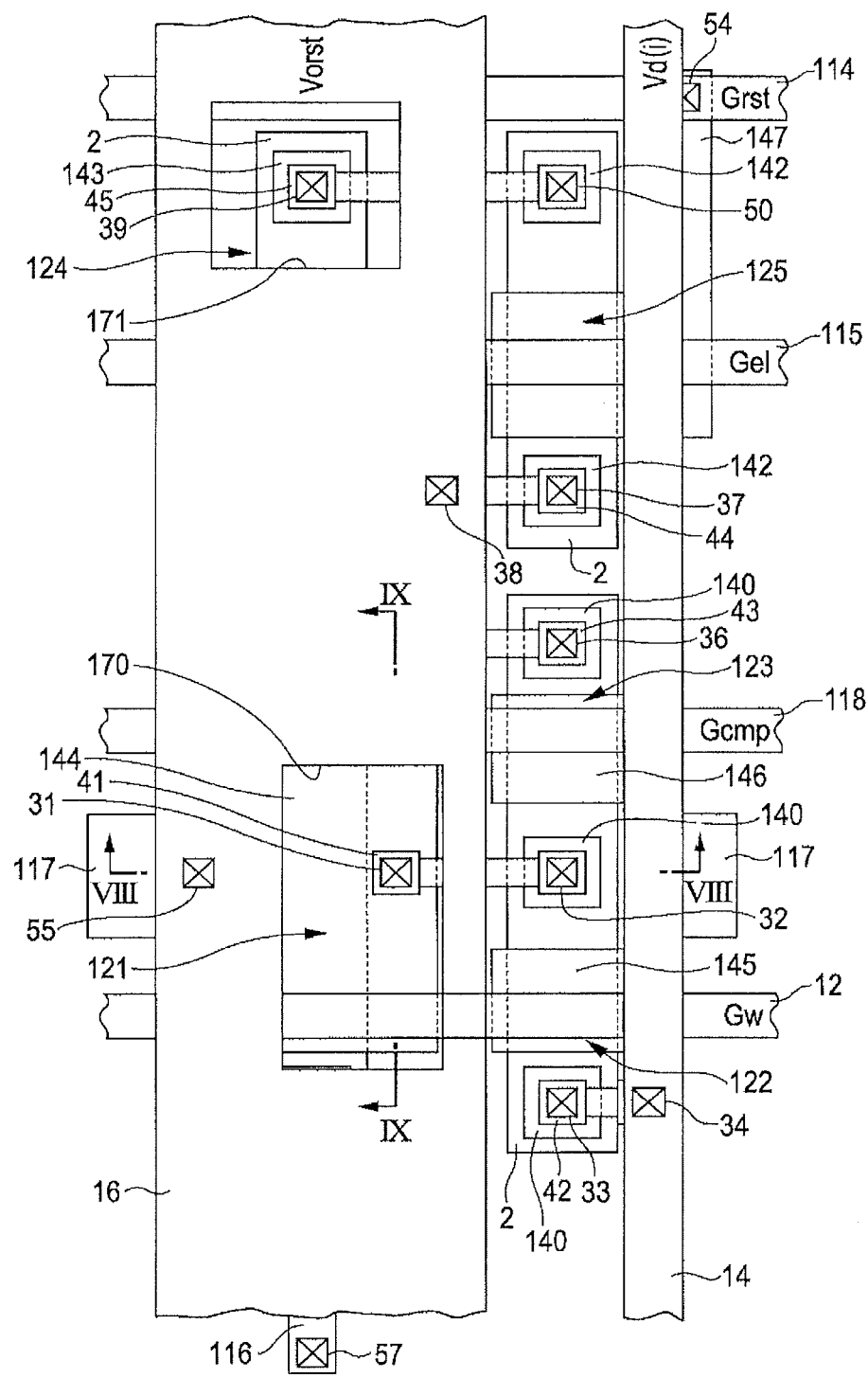
FIG. 6 is a plan view illustrating a configuration of the pixel circuit in the electro-optical device.
Figure 7:
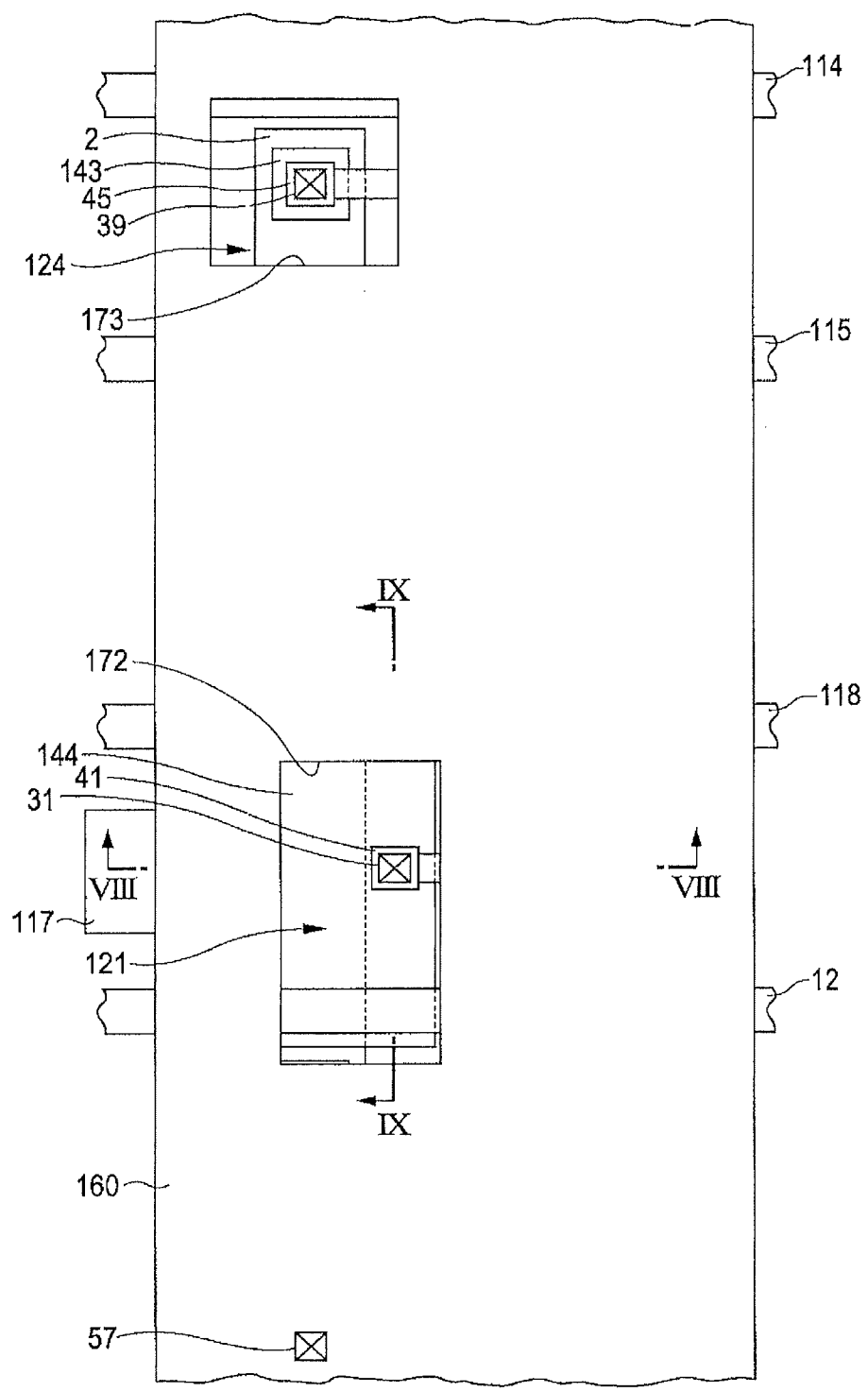
FIG. 7 is a plan view illustrating a configuration of the pixel circuit in the electro-optical device.
Figure 8:
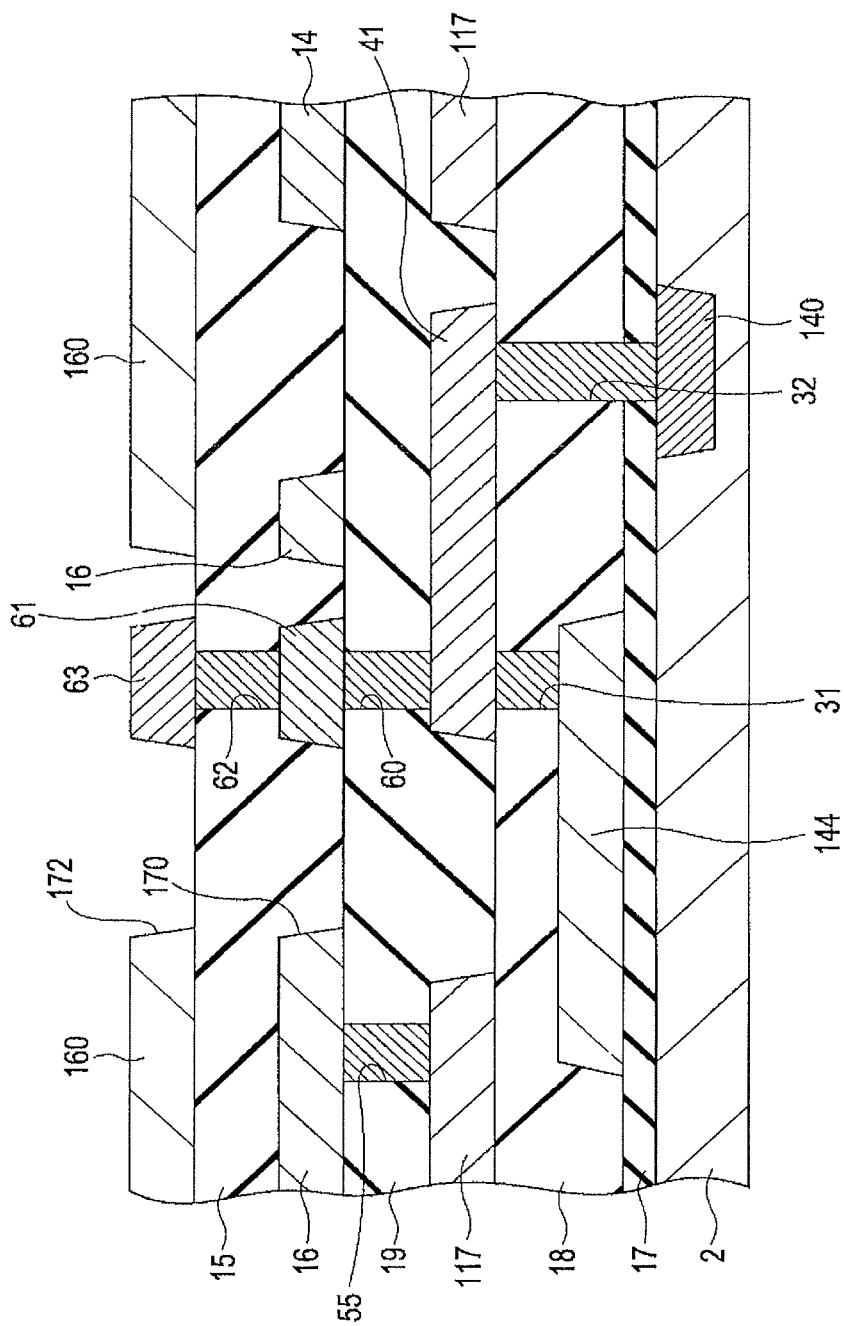
FIG. 8 is a partial sectional view taken along the line VIII-VIII of FIG. 5 to FIG. 7.

With reference to FIG. 5 to FIG. 9, the structure of the pixel circuit 110 will be described next. FIG. 5 is a plan view illustrating a configuration from the substrate to a second interlayer insulating film of one pixel circuit 110, and FIG. 6 is a plan view illustrating a configuration from the substrate to a third interlayer insulating film of one pixel circuit 110. FIG. 7 is a plan view illustrating a configuration in a state where the power supply line is formed on the third interlayer insulating film of FIG. 6. FIG. 8 is a partial sectional view broken along the line VIII-VIII of FIG. 5 to FIG. 7, and FIG. 9 is a partial sectional view broken along the line VI-VI of FIG. 5 to FIG. 7. Note that FIG. 5, which illustrates a wiring structure of the top-emission pixel circuit 110 in plan view from the observation side, omits a structure formed above a power supply line to which the substrate potential Vel is to be supplied, for the sake of simplicity. Additionally, in the drawings referred to hereinafter, the scales of layers, members, and regions are changed so that each of the layers, members, and regions can be recognized.

As illustrated in FIG. 5, a substrate 2 used as the foundation is provided. The substrate 2, which is provided as a flat plate in reality, is represented in islands in FIG. 5 in order to allow the position of each transistor to be readily understood. An active region 143 for formation of a transistor is formed in the substrate 2. The active region as used here is a region in which an MOS transistor is formed, and corresponds to a source or drain region of the MOS transistor. The active region 143 constitutes the transistor 124. Like the active region 143, as illustrated in FIG. 5, active regions 140, 141, and 142 are provided in the substrate 2. The active region 140 constitutes the transistor 122 and the transistor 123, the active region 141 constitutes the transistor 121, and the active region 142 constitutes the transistor 125.

As illustrated in FIG. 8, a gate insulating film 17 is provided in such a manner as to cover the whole surface of the active region 140. As illustrated in FIG. 5, the active region 140 is the source or drain of each of the transistor 122 and transistor 123. In the same layer as the active region 140, the active region 141, which is the source or drain of the transistor 121, the active region 143, which is the source or drain of the transistor 124, and the active region 142, which is the source or drain of the transistor 125, are formed. The gate insulating film 17 illustrated in FIG. 8 is provided in such a manner as to cover almost the whole surface of the active regions 141 to 143. A gate wiring layer of aluminum, polysilicon, or the like is provided on the surface of the gate insulating film 17, and a gate electrode 144 is provided as illustrated in FIG. 8, for example, by patterning the gate wiring layer. The gate electrode 144 is the gate electrode of the transistor 121. As illustrated in FIG. 5, a gate electrode 145 of the transistor 122, a gate electrode 146 of the transistor 123, a gate electrode 148 of the transistor 124, and a gate electrode 147 of the transistor 125 are provided at the same level as the gate electrode 144.

In FIG. 8, a first interlayer insulating film 18 is formed in such a manner as to cover the gate electrode 144 or the gate insulating film 17. A conductive wiring layer is formed on the surface of the first interlayer insulating film 18, and a relay electrode 41 is formed by patterning the wiring layer. In the same layer as the relay electrode 41, the relay electrodes 42, 43, 44, 45, and 46 are formed as illustrated in FIG. 5. Among these relay electrodes, the relay electrode 41 is connected via a contact hole 31, which is formed in the first interlayer insulating film 18, to the gate electrode 144 of the transistor 121. The relay electrode 41 is also connected via a contact hole 32, which is formed in the first interlayer insulating film 18 and in the gate insulating film 17, to the active region 140 of the transistor 122 and the transistor 123. Note that, in FIG. 5, portions denoted by "x" on top of square marks in areas where different types of wiring layers overlap are contact holes.

In FIG. 5, one end of the relay electrode 42 is connected via a contact hole 33, which is formed in the first interlayer insulating film 18, to the active region 140 of the transistor 122, whereas the other end of the relay electrode 42 is connected via a contact hole 34, which is formed in a second interlayer insulating film 19 described below, to the data line 14 described below. One end of the relay electrode 43 is connected via a contact hole 36, which is formed in the first interlayer insulating film 18 and in the gate insulating film 17, to the active region 140 of the transistor 123, whereas the other end of the relay electrode 43 is connected via a contact hole 35, which is formed in the first interlayer insulating film 18 and in the gate insulating film 17, to the active region 141 of the transistor 121. One end of the relay electrode 44 is connected via a contact hole 37, which is formed in the first interlayer insulating film 18 and in the gate insulating film 17, to the active region 142 of the transistor 125, whereas the other end of the relay electrode 44 is connected via a contact hole 38, which is formed in the second interlayer insulating film 19 described below, to the initializing power supply line 16. One end of the relay electrode 45 is connected via a contact hole 39, which is formed in the first interlayer insulating film 18 and in the gate insulating film 17, to the active region 143 of the transistor 124, whereas the other end of the relay electrode 45 is connected via a contact hole 50, which is formed in the first interlayer insulating film 18 and in the gate insulating film 17, to the active region 142 of the transistor 125. One end of the relay electrode 46 is connected via a contact hole 40, which is formed in the first interlayer insulating film 18 and in the gate insulating film 17, to the active region 143 of the transistor 124, whereas the other end of the relay electrode 46 is connected via a contact hole 35, which is formed in the first interlayer insulating film 18 and in the gate insulating film 17, to the active region 141 of the transistor 121.

As illustrated in FIG. 5, the scanning line 12, control lines 114, 115 and 118, a relay electrode 116, and a shield wiring line 117 are formed at the same level as the relay electrodes 41, 42, 43, 44, 45, and 46 mentioned above. The scanning line 12 is connected via a contact hole 51, which is formed in the first interlayer insulation film 18, to the gate electrode 145 of the transistor 122. The control line 118 is connected via a contact hole 52, which is formed in the first interlayer insulation film 18, to the gate electrode 146 of the transistor 123. The control line 114 is connected via a contact hole 54, which is formed in the first interlayer insulation film 18, to the gate electrode 147 of the transistor 125. The control line 115 is connected via a contact hole 53, which is formed in the first interlayer insulation film 18, to the gate electrode 148 of the transistor 124. The relay electrode 116 is connected via a contact hole 57, which is formed in the second interlayer insulating film 19 and in a third interlayer insulating film 15 described below, to the high potential power supply line 160 described below.

Furthermore, when seen in plan view, the shield wiring line 117 extends from below the initializing power supply line 16 in a pixel located immediately on the right side of the pixel illustrated in FIG. 5 to a location below the data line 14 (the data line 14 is illustrated in FIG. 6) of the pixel illustrated in FIG. 5, and is formed so as to have a large width in the longitudinal direction of the data line 14 as illustrated in FIG. 5. The shield wiring line 117 above the gate electrode 144 of the transistor 121 illustrated in FIG. 5 extends to the data line 14 of a pixel located immediately on the left side of the pixel illustrated in FIG. 5. As illustrated in FIG. 8, the shield wiring line 117 is connected via a contact hole 55, which is formed in the second interlayer insulating film 19 described below, to the initializing power supply line 16.

Figure 9:
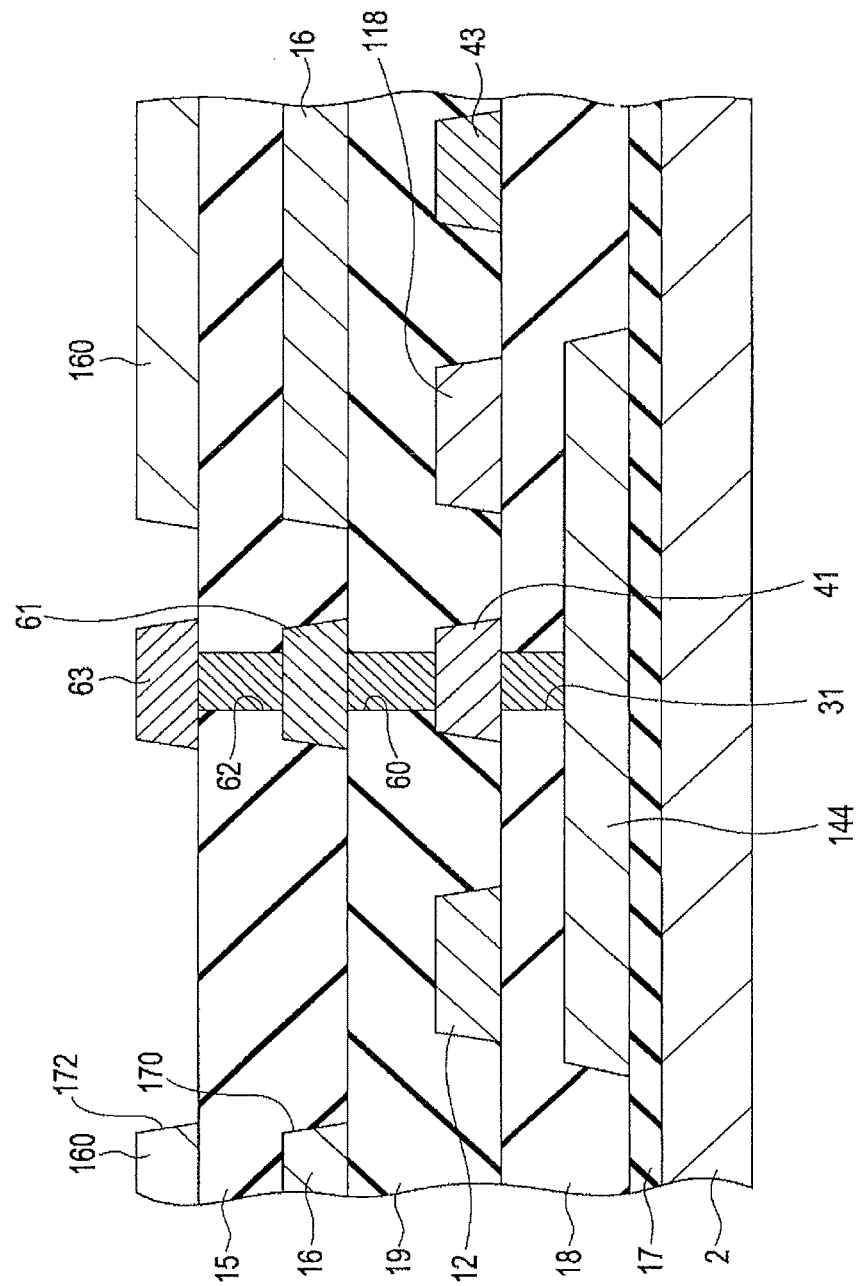
FIG. 9 is a partial sectional view taken along the line IV-IV of FIG. 5 to FIG. 7.

As illustrated in FIG. 8, the second interlayer insulating film 19 is formed in such a manner as to cover the relay electrodes 41, 42, 43, 44, 45, and 46, the scanning line 12, the control lines 118, 114, and 115, the relay electrode 116, the shield wiring line 117 or the first interlayer insulating film 18. A conductive wiring layer is formed on the surface of the second interlayer insulating film 19, and the data line 14 and the initializing power supply line 16 are formed by patterning the wiring layer. FIG. 6 is a drawing of a state where the data line 14 and the initializing power supply line 16 are formed on the surface of the second interlayer insulating film 19, when seen in plan view. As illustrated in FIG. 6, the initializing power supply line 16 is formed so as to cover the whole surfaces of the transistor 121 and transistor 124. However, an opening 170 is formed in the initializing power supply line 16, and is structured in such a manner as to surround a connection portion on four sides. The connection portion extends from the gate electrode 144 of the transistor 121 to the contact hole 31 and the relay electrode 41. Note that, although not illustrated in FIG. 6, as illustrated in FIG. 8 and FIG. 9, a relay electrode 61 is formed via a contact hole 60, which is formed in the second interlayer insulating film 19, at a position in an upper layer of the connection portion extending from the gate electrode 144 of the transistor 121 to the contact hole 31 and the relay electrode 41.

The initializing power supply line 16 is connected via the contact hole 38, which is formed in the second interlayer insulating film 19, to the relay electrode 44, and is connected via the relay electrode 44 to the active region 142 of the transistor 124. As illustrated in FIG. 8, the initializing power supply line 16 is connected via the contact hole 55, which is formed in the second interlayer insulating film 19, to the shield wiring line 117.

Furthermore, in this embodiment, an opening 171 is formed in the initializing power supply line 16, and is structured in such a manner as to surround the periphery of the connection portion extending from the active region 143 of the transistor 124 and being connected to an upper layer. The anode of the OLED 130 is connected to this connection portion in the upper layer.

The data line 14 is formed in the same layer as the initializing power supply line 16. The data line 14 is connected via the contact hole 34, which is formed in the second interlayer insulating film 19, to the relay electrode 42. When the pixel pitch is narrowed, as illustrated in FIG. 6, the data line 14 becomes closer to the connection portion of the gate electrode 144 of the transistor 121, the communication portion extending toward the top layer. However, as described above, the connection portion is surrounded on four sides by the initializing power supply line 16. Therefore, the connection portion of the gate electrode 144 extending toward the upper layer is not affected by noise caused by variations in the potential of the data line 14.

As illustrated in FIG. 8 and FIG. 9, the third interlayer insulating film 15 is formed so as to cover the whole surfaces of the initializing power supply line 16, the data line 14, and the relay electrode 61. On the surface of the third interlayer insulating layer 15, the high potential power supply line 160 is formed as illustrated in FIG. 8 and FIG. 9. FIG. 7 is a drawing of a state where the high potential power supply line 160 is formed on the surface of the third interlayer insulating film 15, when seen in plan view. As illustrated in FIG. 7, the high potential power supply line 160 is formed so as to cover the entire pixel. An opening 172 is formed in the high potential power supply line 160, and is structured in such a manner as to surround a connection portion on four sides. The connection portion extends from the gate electrode 144 of the transistor 121 to the contact hole 31 and the relay electrode 41, and further to the contact hole 60 and the relay electrode 61. Note that, although not illustrated in FIG. 7, as illustrated in FIG. 8 and FIG. 9, a relay electrode 63 is formed via a contact hole 62, which is formed in the third interlayer insulating film 15, at a position in the top layer of the connection portion extending from the gate electrode 144 of the transistor 121 to the contact hole 31 and the relay electrode 41, and further to the contact hole 60 and the relay electrode 61.

In this embodiment, an opening 173 is formed in the high potential power supply line 160, and is structured in such a manner as to surround the periphery of the connection portion extending from the active region 143 of the transistor 124 and being connected to an upper layer. The anode of the OLED 130 is connected to this connection portion in the upper layer. Furthermore, the high potential power supply line 160 is connected via a contact hole 57, which is formed in the second interlayer insulating film 19 and in the third interlayer insulating film 15, to the relay electrode 116. Through this connection line, the substrate potential Vel is supplied to the source node or the drain node of the transistor 121.

Note that although the structure from this point onward of the electro-optical device 10 is not illustrated, the opening 171 of the initializing power supply line 16 and the opening 173 of the high potential power supply line 160 allow the anode of OLED 130 to be connected to the connection portion extending from the active region 143 of the transistor 124 and being connected to an upper layer. The connection portion is surrounded by the initializing power supply line 16 and the high potential power supply line 160. On the anode of the OLED 30, a light emitting layer made of an organic EL material is laminated for each pixel circuit 110, and a transparent electrode common to all the pixel circuits 110 is provided as the common electrode 118, which serves also as the cathode. Thus, a light emitting element 150 is an OLED in which the anode and the cathode opposite to each other sandwich the light emitting layer, and emits light with luminance in accordance with a current flowing from the anode to the cathode. The emitted light is observed such that it travels toward the opposite to the substrate 2 (top emission structure). In addition, sealing glass for shielding the light emitting layer from the atmosphere, and the like are provided. Description of this is omitted.

A gate node electrode is formed in the top layer of the connection portion extending from the gate electrode 144 of transistor 121 to the contact hole 31 and the relay electrode 41, to the contact hole 60 and the relay electrode 61, and further to the contact hole 62 and the relay electrode 63. The storage capacitor 132 illustrated in FIG. 3 is formed between the bottom layer of this gate node electrode and the high potential power supply line 160. This is, however, not illustrated in FIG. 8 and FIG. 9 for the sake of simplicity. As described above, in the connection portion extending from the gate electrode 144 of the transistor 121 to the gate node electrode of the top layer, the relay electrode 61 formed in the same layer as the data line 14 is surrounded on four sides by the opening 170 of the initializing power supply line 16. In the connection portion, the relay electrode 63 formed above the relay electrode 61 is surrounded on four sides by the opening 172 of the high potential power supply line 160. Accordingly, even if variations in the potential levels of the data lines 14 cause noise, the noise of the data lines 14 is prevented from invading the gate electrode of the transistor 121, which functions as a driving transistor, by the initializing power supply line 16 and the high potential power supply line 160. As a result, the data signals accumulated in the storage capacitor do not change, and the current supplied via the transistor 121, which functions as a driving transistor, to the OLED 130 also does not change. Thus, display with accurate luminance is performed. Furthermore, in this embodiment, since the connection portion extending to the anode of the OLED 130 is surrounded on four sides by the initializing power supply line 16 and the high potential power supply line 160, noise caused by variations in the potential levels of the data lines 14 does not invade the anode of the OLED 130. Thus, display with accurate luminance will be performed more reliably. Additionally, in this embodiment, the shield wiring line 117 connected to the initializing power supply line 16 in a pixel adjacent to the pixel in question extends to a location where the shield wiring line 117 crosses the data line 14 of the pixel in question. At this intersection, a parallel-plate capacitor is formed. The parallel-plate capacitor causes the field intensity from the data line 14 to the gate wiring of the transistor 121 to become weaker, thereby significantly reducing a parasitic capacitance. As a result, the effect of the data line 14 on the gate wiring of the transistor 121 may be more reduced. Furthermore, noise is applied to the shield pattern 117 itself; however, the noise application has no effect on display quality of the pixel in question because the shield pattern 117 extends from the adjacent pixel to which a picture signal will be written next time. Even if variations due to noise occur in the adjacent pixel, a normal picture signal is to be written at the next timing, and therefore the variations have no effect on display quality.

Applications and Modifications

The invention is not limited to the above embodiment, applications, and the like, and various modifications as described below, for example, may be made. Among examples of modifications described below, one or a plurality of examples arbitrarily selected may be appropriately combined.

Control Circuit

In the embodiment, the control circuit 5 that supplies data signals is formed separately from the electro-optical device 10. However, the control circuit 5, together with the scanning line driving circuit 20, the demultiplexer 30, and a level shift circuit 40, may be integrated in a silicon substrate.

Substrate

In the configuration of the embodiment, the electro-optical device 10 is integrated in a silicon substrate. Another configuration in which this device is integrated in another semiconductor substrate may be used. In addition, this device may be formed in a glass substrate or the like by application of a polysilicon process. Any of these ways is effective for such a configuration that the pixel circuit 110 is miniaturized and, in the transistor 121, variations in drain current are exponentially large relative to variations in the gate voltage Vgs.

Control Signal Gcmp(i)

In the embodiment and the like, regarding the i-th row, the control signal Gcmp(i) is at level H during the writing period. However, the control signal Gcmp(i) may be at level L. That is, there may be used a configuration in which compensation for the threshold caused by the transistor 123 turning on is performed in parallel with writing to the node gate g.

Channel Types of Transistors

In the foregoing embodiment, the transistors 121 to 125 in the pixel circuit 110 are uniformly of the p-channel type. However, they may be uniformly of the n-channel type. The p-channel transistors and the n-channel transistors may also be combined appropriately.

Shield in Connection Portion of Gate Electrode of Driving Transistor

In the foregoing embodiment, a description has been given of the example configuration in which the relay electrode 61 at the same level as the data line 14, that is, a portion at the same level as the data line 14 of the connection portion from the gate electrode 44 of the transistor 121, which functions as the driving transistor, to the top layer is surrounded on four sides by the initializing power supply line 16. However, the invention is not limited to such a configuration. The wiring line that surrounds the connection portion may be a wiring line maintained at the potential Vct, which is on the low side of the power supply. Any of these wiring lines is lower in impedance than a power supply wiring line used in the scanning line driving circuit 20, the data line driving circuit 30, or the like. Use of such a wiring line as a shield line more improves the shield effect. Moreover, in the foregoing embodiment, not only the connection portion at the same level as the data line 14 is surrounded by the initializing power supply line 16, but also the relay electrode 63 at the same level as the high potential power supply line 160, of the connection portion extending from the gate electrode 144 of the transistor 121 to the top layer, is surrounded by the high potential power supply line 160. However, the connection portion may be surrounded either the initializing power supply line 16 or the high potential power supply line 160. Moreover, in the foregoing embodiment, a description has been given of the example in which the connection portion extending from the gate electrode 144 of the transistor 121 to an upper layer is surrounded on four sides by a power supply wiring line. However, the connection portion may be surrounded on at least three sides. For example, even if a slit that follows the opening 170 or the opening 171 illustrated in FIG. 6 or a slit that follows the opening 172 or the opening 173 illustrated in FIG. 7 is formed in the initializing power supply line 16 or in the high potential power supply line 160, a desired shield effect is acquired when most of the connection portion extending from the gate electrode 144 of the transistor 121 to an upper layer is surrounded by the initializing power supply line 16 or the high potential power supply line 160.

Miscellaneous

In the embodiment and the like, the OLED, which is a light emitting element, has been illustrated as an electro-optical device. However, any element that emits light with luminance in accordance with current, such as an inorganic light emitting diode or a light emitting diode (LED), may be used.

Electronic Apparatus

An electronic apparatus to which the electro-optical device 10 according to the embodiment or the like, or an application example, is applied will be described next. The electro-optical device 10 is suitable for applications in which high definition display is desirable with small-size pixels. Accordingly, a head-mounted display will be described by way of example as an electronic apparatus.

FIG. 10 illustrates the external appearance of a head-mounted display, and FIG. 11 illustrates an optical configuration of the head-mounted display. As illustrated in FIG. 10, a head-mounted display 300 includes temples 310, a bridge 320, and lenses 301L and 301R, like typical glasses in terms of the external appearance. In addition, as illustrated in FIG. 11, the head-mounted display 300 is provided with an electro-optical device 10L for a left eye and an electro-optical device 10R for a right eye near the bridge 320 and on a back side (on a lower side in the drawing) of the lenses 301L and 301R, respectively. The image display surface of the electro-optical device 10L is disposed to the left of FIG. 11. This causes a display image created by the electro-optical device 10L to travel through an optical lens 302L in the direction of 9:00 in the drawing. A half mirror 303L reflects the display image from the electro-optical device 10L in the direction of 6:00, and allows light that has entered from the direction of 12:00 to pass therethrough. The image display surface of the electro-optical device 10R is disposed to the right of the drawing, which is opposite to the image display surface of the electro-optical device 10L. This causes a display image created by the electro-optical device 10R to travel through an optical lens 302R in the direction of 3:00 in the drawing. A half mirror 303R reflects the display image from the electro-optical device 10R in the direction of 6:00, and allows light that has entered from the direction of 12:00 to pass therethrough.

With this configuration, a person wearing the head-mounted display 300 can observe display images created by the electro-optical devices 10L and 10R in a see-through state in which the display images are superimposed over the outside scene. When, in the head-mounted display 300, one of both eyes' images with a parallax, that is, an image for a left eye is displayed on the electro-optical device 10L and the other, that is, an image for a right eye is displayed on the electro-optical device 10R, a person wearing the head-mounted display 300 can perceive a displayed image as if this image had depth and a cubic effect (three dimensional (3D) display).

Note that the electro-optical device 10 is applicable to an electronic view finder in a video camera, an interchangeable lens digital camera, and the like, in addition to the head-mounted display 300.

The entire disclosure of Japanese Patent Application No. 2012-111567, filed May 15, 2012 is expressly incorporated by reference herein.

What is claimed is:

1. An electro-optical device comprising:
   a data line;
   a power supply wiring line;
   a light emitting element;
   a relay electrode; and
   a driving transistor controlling an electrical connection between the power supply wiring line and the light emitting element, the driving transistor having a gate electrode electrically connected to the relay electrode, wherein
   the relay electrode is formed in a same layer as the power supply wiring line,
   the relay electrode is surrounded on at least three sides by the power supply wiring line, and
   the power supply wiring line overlaps the gate electrode of the driving transistor in plan view.

2. The electro-optical device according to claim 1, wherein
   a portion of the power supply wiring line is disposed between the relay electrode and the data line in plan view.

3. The electro-optical device according to claim 1, wherein
   the relay electrode is surrounded on four sides by an opening formed in the power supply wiring line.

4. The electro-optical device according to claim 1, further comprising
   a storage capacitor having a first electrode and a second electrode, wherein
   the first electrode of the storage capacitor is electrically connected to the relay electrode, and
   the second electrode of the storage capacitor is electrically connected to the power supply wiring line.

5. The electro-optical device according to claim 4, wherein
   the second electrode is formed over the first electrode.

6. The electro-optical device according to claim 1, further comprising
   a storage capacitor, the storage capacitor being formed in an upper layer of the relay electrode.

7. An electronic apparatus comprising the electro-optical device according to claim 1.

8. An electro-optical device comprising:
   a data line;
   a power supply wiring line;
   a light emitting element;
   a relay electrode;
   a driving transistor controlling an electrical connection between the power supply wiring line and the light emitting element, the driving transistor having a gate electrode electrically connected to the relay electrode; and
   a storage capacitor having a first electrode and a second electrode, wherein
   the relay electrode is formed in a same layer as the power supply wiring line,
   the relay electrode is surrounded on at least three sides by the power supply wiring line,
   the first electrode of the storage capacitor is electrically connected to the relay electrode,
   the second electrode of the storage capacitor is electrically connected to the power supply wiring line, and
   the second electrode is formed over the first electrode.

9. The electro-optical device according to claim 8, wherein
   a portion of the power supply wiring line is disposed between the relay electrode and the data line in plan view.

10. The electro-optical device according to claim 8, wherein the relay electrode is surrounded on four sides by an opening formed in the power supply wiring line.

11. The electro-optical device according to claim 8, further comprising
the storage capacitor, the storage capacitor being formed in an upper layer of the relay electrode.

12. An electronic apparatus comprising the electro-optical device according to claim 8.

13. An electro-optical device comprising:
a data line;
a power supply wiring line;
a light emitting element;
a relay electrode;
a driving transistor controlling an electrical connection between the power supply wiring line and the light emitting element, the driving transistor having a gate electrode electrically connected to the relay electrode; and
a storage capacitor, the storage capacitor being formed in an upper layer of the relay electrode, wherein
the relay electrode is formed in a same layer as the power supply wiring line, and
the relay electrode is surrounded on at least three sides by the power supply wiring line.

14. The electro-optical device according to claim 13, wherein
the power supply wiring line overlaps the gate electrode of the driving transistor in plan view.

15. The electro-optical device according to claim 13, wherein
a portion of the power supply wiring line is disposed between the relay electrode and the data line in plan view.

16. The electro-optical device according to claim 13, wherein
the relay electrode is surrounded on four sides by an opening formed in the power supply wiring line.

17. The electro-optical device according to claim 13, further comprising
the storage capacitor having a first electrode and a second electrode, wherein
the first electrode of the storage capacitor is electrically connected to the relay electrode, and
the second electrode of the storage capacitor is electrically connected to the power supply wiring line.

18. An electronic apparatus comprising the electro-optical device according to claim 13.

* * * * *